(12) United States Patent
Farrar

(10) Patent No.: US 8,470,642 B2
(45) Date of Patent: Jun. 25, 2013

(54) HIGH DENSITY CHIP PACKAGES, METHODS OF FORMING, AND SYSTEMS INCLUDING SAME

(75) Inventor: Paul A. Farrar, Bluffton, SC (US)

(73) Assignee: Micron Technology, Inc., Boise, ID (US)

(*) Notice: Subject to any disclaimer, the term of this patent is extended or adjusted under 35 U.S.C. 154(b) by 220 days.

(21) Appl. No.: 12/833,593

(22) Filed: Jul. 9, 2010

(65) Prior Publication Data

US 2010/0271777 A1 Oct. 28, 2010

Related U.S. Application Data

(62) Division of application No. 11/583,411, filed on Oct. 19, 2006, now Pat. No. 7,754,532.

(51) Int. Cl.
*H01L 21/44* (2006.01)
(52) U.S. Cl.
USPC ............. 438/113; 438/15; 438/109; 257/678; 257/686; 257/698; 257/777; 257/E21.705
(58) Field of Classification Search
None
See application file for complete search history.

(56) References Cited

U.S. PATENT DOCUMENTS

| | | |
|---|---|---|
| 4,807,194 A | 2/1989 | Yamada et al. |
| 4,923,521 A | 5/1990 | Venntolo |
| 5,202,754 A | 4/1993 | Bertin et al. |
| 5,270,261 A | 12/1993 | Bertin et al. |
| 5,457,354 A | 10/1995 | Tu Tay |
| 5,656,553 A | 8/1997 | Leas et al. |
| 5,719,070 A | 2/1998 | Cook et al. |
| 5,719,438 A | 2/1998 | Beilstein, Jr. et al. |
| 5,723,894 A | 3/1998 | Ueno et al. |
| 5,731,945 A | 3/1998 | Bertin et al. |
| 5,781,031 A | 7/1998 | Bertin et al. |
| 5,818,748 A | 10/1998 | Bertin et al. |
| 5,892,288 A | 4/1999 | Muraki et al. |
| 5,995,379 A | 11/1999 | Kyougoku et al. |
| 6,136,689 A | 10/2000 | Farrar |
| 6,337,513 B1 | 1/2002 | Clevenger et al. |
| 6,507,117 B1 | 1/2003 | Hikita et al. |
| 6,557,013 B1 | 4/2003 | Ziff et al. |
| 6,670,719 B2 | 12/2003 | Eldridge et al. |
| 6,756,305 B1 | 6/2004 | Conn |
| 6,760,224 B2 | 7/2004 | Moden et al. |

(Continued)

FOREIGN PATENT DOCUMENTS

| | | |
|---|---|---|
| JP | 2005072596 A | 3/2005 |
| SG | 151656 A | 9/2011 |
| WO | WO-2008051415 A1 | 5/2008 |
| WO | WO-2008051415 A9 | 5/2008 |

OTHER PUBLICATIONS

"Chinese Application Serial No. 200780038876.3, Response to Office Action mailed May 28, 2010", 11 pgs.

(Continued)

*Primary Examiner* — Kyoung Lee
(74) *Attorney, Agent, or Firm* — Schwegman, Lundberg & Woessner, P.A.

(57) ABSTRACT

Methods and devices for multi-chip stacks are shown. A method is shown that assembles multiple chips into stacks by stacking wafers prior to dicing into individual chips. Methods shown provide removal of defective chips and their replacement during the assembly process to improve manufacturing yield.

20 Claims, 4 Drawing Sheets

U.S. PATENT DOCUMENTS

| | | | |
|---|---|---|---|
| 6,878,396 | B2 | 4/2005 | Farrar et al. |
| 6,908,785 | B2 | 6/2005 | Kim |
| 6,909,171 | B2 | 6/2005 | Eldridge et al. |
| 6,958,287 | B2 | 10/2005 | Farrar et al. |
| 7,276,799 | B2 | 10/2007 | Lee et al. |
| 7,754,532 | B2 | 7/2010 | Farrar |
| 7,952,184 | B2 | 5/2011 | Farrar et al. |
| 8,237,254 | B2 | 8/2012 | Farrar et al. |
| 2002/0025587 | A1 | 2/2002 | Wada |
| 2002/0141233 | A1 | 10/2002 | Hosotani et al. |
| 2003/0178228 | A1 | 9/2003 | Sung et al. |
| 2004/0007771 | A1 | 1/2004 | Shin et al. |
| 2004/0070063 | A1 | 4/2004 | Leedy |
| 2004/0162971 | A1 | 8/2004 | Joy et al. |
| 2004/0238933 | A1 | 12/2004 | Chen et al. |
| 2004/0262772 | A1 | 12/2004 | Ramanathan et al. |
| 2005/0095733 | A1 | 5/2005 | Priewasser et al. |
| 2005/0269665 | A1 | 12/2005 | Wylie et al. |
| 2005/0280160 | A1 | 12/2005 | Kim et al. |
| 2006/0170112 | A1 | 8/2006 | Tanaka |
| 2006/0235577 | A1 | 10/2006 | Ikeda et al. |
| 2006/0292752 | A1 | 12/2006 | Connell et al. |
| 2007/0007983 | A1 | 1/2007 | Salmon |
| 2007/0158807 | A1 | 7/2007 | Lu et al. |
| 2007/0210447 | A1 | 9/2007 | Kinsley |
| 2008/0054489 | A1* | 3/2008 | Farrar et al. .......... 257/777 |
| 2008/0096320 | A1 | 4/2008 | Farrar |
| 2010/0193838 | A1 | 8/2010 | Farrar |
| 2011/0222328 | A1 | 9/2011 | Farrar et al. |
| 2012/0302006 | A1 | 11/2012 | Farrar et al. |

OTHER PUBLICATIONS

"European Application Serial No. 07839619.9, Response filed Jul. 28, 2010 to Office Action Received Mar. 19, 2010", 16 pgs.

"Chinese Application Serial No. 200780038876.3, Office Action mailed Dec. 16, 2010", 6 pgs.

"Chinese Application Serial No. 200780038876.3, Response filed Feb. 14, 2011 to Office Action mailed Dec. 16, 2010", 7 pgs.

"European Application Serial No. 07839619.9, Summon to attend Oral Proceeding mailed Feb. 22, 2011", 5 pgs.

Miller, L. F, "Multiple Reflow Titanium Platinum Metallurgy", *IBM Technical Disclosure Bulletin*, (Jun. 1973), 39.

"U.S. Appl. No. 11/514,557, Notice of Allowance mailed Jan. 25, 2011", 11 pgs.

"Chinese Application Serial No. 200780038876.3, Office Action mailed May 26, 2011", with English translation, 7 pgs.

"Chinese Application Serial No. 200780038876.3, Office Action mailed Dec. 16, 2010-2011", with English translation, 6 pgs.

"Chinese Application Serial No. 200780038876.3, response filed Jul. 26, 2011 to Office Action mailed May 26, 2011", with English translation, 20 pgs.

"Chinese Application Serial No. 200780038876.3, Response filed Feb. 14, 2011 to Office Action mailed Dec. 16, 2010", with English translation, 7 pgs.

"Chinese Application Serial No. 200780038876.3, Office Action mailed Aug. 11, 2011", 3 pgs.

"Chinese Application Serial No. 200780038876.3, Office Action mailed Dec. 8, 2011", 2 pgs.

"Chinese Application Serial No. 200780038876.3, Response filed Oct. 14, 2011 to Office Action mailed Aug. 11, 2011", 4 pgs.

"Chinese Application Serial No. 200780038876.3, Response filed Feb. 8, 2012 to Office Action mailed Dec. 8, 2011", 4 pgs.

"Taiwanese Application Serial No. 096139355, Office Action mailed Oct. 20, 2011", 10 pgs.

"Taiwanese Application Serial No. 096139355, Response filed Jan. 4, 2012 to Office Action mailed Oct. 20, 2011", 4 pgs.

"Japanese Application Serial No. 2009-533356, Response filed Dec. 6, 2012 to Office Action mailed Aug. 7, 2012", 9 pgs.

"Japanese Application U.S. Appl. No. 2009-533356, Office Action mailed Aug. 7, 2012", 2 pgs.

* cited by examiner

HIGH DENSITY CHIP PACKAGES, METHODS OF FORMING, AND SYSTEMS INCLUDING SAME

RELATED APPLICATION

This application is a divisional of U.S. application Ser. No. 11/583,411, filed Oct. 19, 2006 now U.S. Pat. No. 7,754,532, which is incorporated herein by reference in its entirety.

TECHNICAL FIELD

This application relates generally to semiconductor devices and device fabrication and, more particularly, to embodiments of multi-chip packages.

BACKGROUND

An ever present goal in the semiconductor industry has been to decrease the size of devices and to increase the performance of devices. However, both of these goals present large technical hurdles as the two goals are often in conflict with each other.

As the minimum feature size achievable in semiconductor manufacturing decreases, the capacitive coupling between adjacent metal lines becomes a significant impediment to achieving higher performance. Further, as the minimum feature size decreases, the number of devices potentially achievable in a given area increases, as a second power function. The number of wiring connections is increasing at least as rapidly. In order to accommodate the increased wiring, the chip designer would like to shrink the space between adjacent lines to the minimum achievable dimension. This has the unfortunate effect of increasing the capacitive load.

One way to accommodate the increased wiring and reduce capacitive load is to substitute lower dielectric constant materials for the insulating material. A common insulating material to date is $SiO_2$, which has a dielectric constant of around 4. $SiO_2$ is now used in most very large scale integrated circuit (VLSI) chips. Another way to accommodate the increased wiring and reduce capacitive load is to shorten the distance between devices by denser packaging.

Multi-chip stacking has been proposed in the past; however, one significant concern with stacking chips (i.e. memory chips, logic chips, processor chips, etc.) is the manufacturing yield of the assembly. Because any given wafer will currently have a percentage of defective chips on its surface, when multiple wafers are stacked, for example 10 wafers high, the likelihood of at least one defective chip in any given stack goes up significantly. Alternatively, stacking individual chips that have been tested and known to be good involves a greater amount of high precision handling when compared to stacking wafers prior to dicing. In either scenario, a high amount of loss due to manufacturing yield is present.

What are needed are methods and devices that improve the manufacturing yield of large numbers of stacked chips in a multi-chip assembly. What are also needed are improved methods and devices to enhance performance, reduce size, and improve other properties and features of multi-chip assemblies.

DETAILED DESCRIPTION

Figure 1:
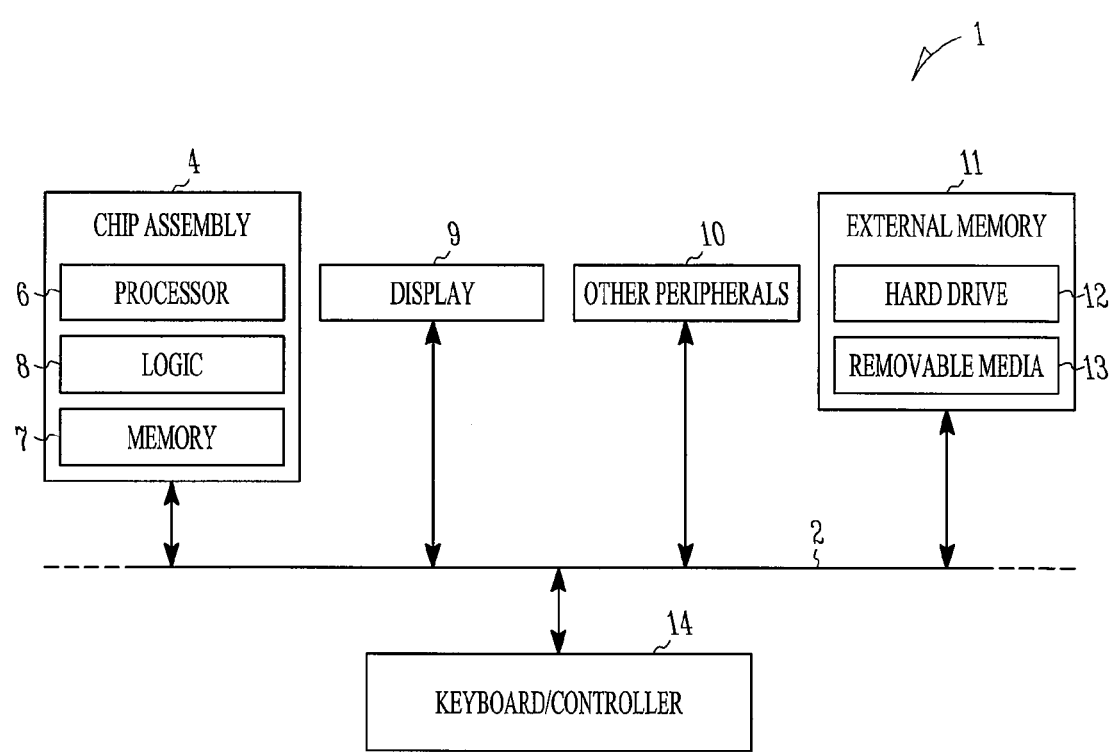
FIG. 1 shows an electronic system according to an embodiment of the invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms "wafer" and "substrate" used in the following description include any structure having an exposed surface with which to form an integrated circuit (IC) structure of the invention. The term substrate is understood to include semiconductor wafers. The term substrate is also used to refer to semiconductor structures during processing and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Although the terms "memory chip" and "logic chip" are used in the following description, one of ordinary skill in the art will recognize that in one embodiment, a chip may include both memory circuitry and logic circuitry on the same chip. A chip with both memory circuitry and logic circuitry on the same chip is defined to be both a "memory chip" and a "logic chip" as used in the following description. The following detailed description is, therefore, not to be taken in a limiting sense and the scope of the present invention is defined only by the appended claims, along with the full scope of equivalents to which such claims are entitled.

An embodiment of an information handling system such as a personal computer is included to show an embodiment of a high-level device application for the present invention. FIG. 1 is a block diagram of an information handling system 1 incorporating at least one multi-chip assembly 4 formed by methods in accordance with one embodiment of the invention. Information handling system 1 is merely one embodiment of an electronic system in which the present invention can be used. Other examples include, but are not limited to, personal data assistants (PDAs), cellular telephones, MP3 players, aircraft, satellites, military vehicles, etc.

In this example, information handling system 1 comprises a data processing system that includes a system bus 2 to couple the various components of the system. System bus 2 provides communications links among the various components of the information handling system 1 and may be implemented as a single bus, as a combination of busses, or in any other suitable manner.

Multi-chip assembly 4 is coupled to the system bus 2. Multi-chip assembly 4 may include any circuit or operably compatible combination of circuits. In one embodiment, multi-chip assembly 4 includes a processor 6 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory chip 7 is included in the multi-chip assembly 4. Those skilled in the art will recognize that a wide variety of memory chips may be used in the multi-chip assembly 4. Acceptable types of memory chips include, but are not limited to, Dynamic Random Access Memory (DRAMs) such as SDRAMs, SLDRAMs, RDRAMs and other DRAMs. Memory chip 7 can also include non-volatile memory such as flash memory.

In one embodiment, additional logic chips 8 other than processor chips are included in the multi-chip assembly 4. An example of a logic chip 8 other than a processor includes an analog to digital converter. Other circuits on logic chips 8 such as custom circuits, an application-specific integrated circuit (ASIC), etc. are also included in one embodiment of the invention.

Information handling system 1 may also include an external memory 11, which in turn can include one or more memory elements suitable to the particular application, such as one or more hard drives 12, and/or one or more drives that handle removable media 13 such as floppy diskettes, compact disks (CDs), digital video disks (DVDs), and the like.

Information handling system 1 may also include a display device 9 such as a monitor, additional peripheral components 10, such as speakers, etc. and a keyboard and/or controller 14, which can include a mouse, trackball, game controller, voice-recognition device, or any other device that permits a system user to input information into and receive information from the information handling system 1.

Figure 2A:
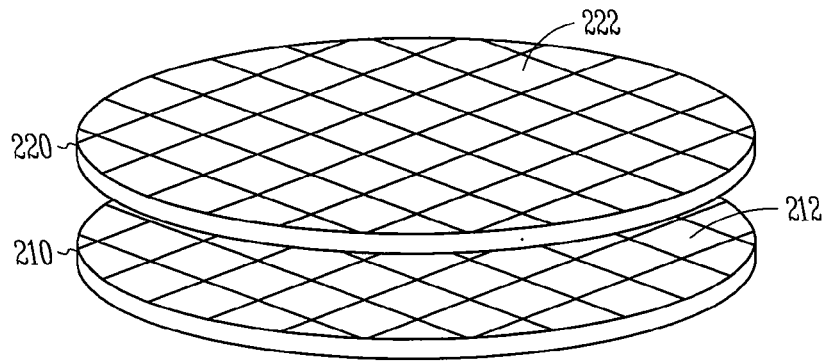
FIG. 2A-2C show two wafers in various stages of chip assembly according to an embodiment of the invention.
Figure 2B:
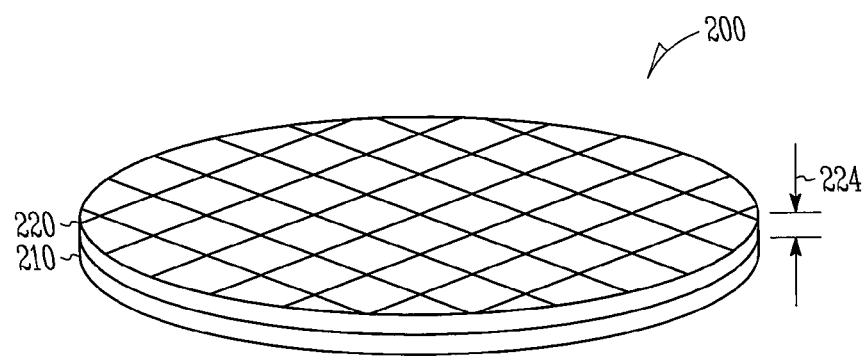
Figure 2C:
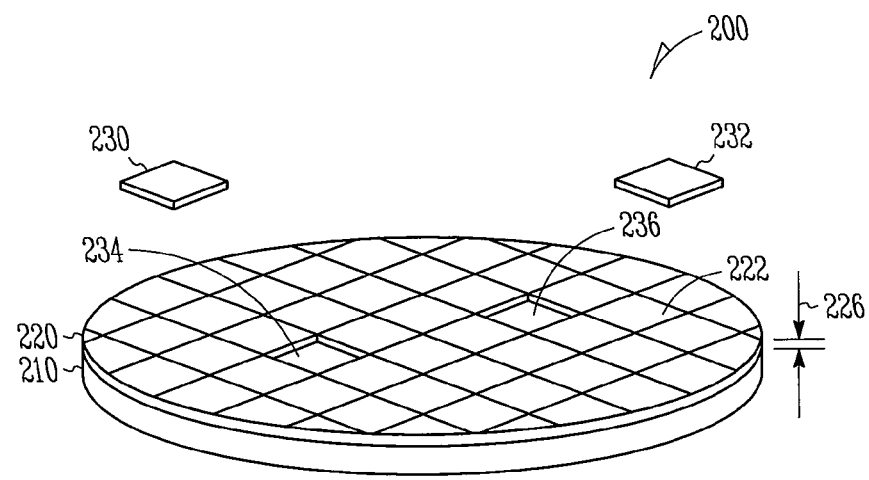

FIGS. 2A-2C show selected acts in a process of forming multi-chip packages according to an embodiment of the invention. In FIG. 2A, a first wafer 210 and a second wafer 220 are shown. The first wafer 210 includes a number of individual chips 212 and the second wafer includes a number of individual chips 222.

In FIG. 2B, the second wafer 220 is electrically coupled to the first wafer 210 to form a wafer assembly 200. In the operation, each of the multiple individual chips 212 are aligned and coupled with multiple individual chips 222. In wafer form, the joining process between chips 212 and 222 is easier and produces a higher manufacturing yield. Among other factors, the larger size makes handling and connection easier between chips on the first wafer 210 and the second wafer 220. Also the interconnection process joins multiple chips 212, 222 in a single operation.

In FIG. 2B, the second wafer 220 is shown having a thickness 224. In one method of manufacture, the individual chips 222 are partially scored in the wafer 220 prior to attachment to the first wafer 210. In one method the scored side of the second wafer 220 is located at the interface between the first wafer 210 and the second wafer 220 after joining as shown in FIG. 2B.

FIG. 2C shows a stage in one method of manufacture where the second wafer 220 is thinned from thickness 224 as shown in FIG. 2B to a thickness 226 as shown in FIG. 2C. In one method of manufacture, the partial scoring of the second wafer 220 is completed by the thinning process in FIG. 2C to allow separation of individual chips 222. Although partial scoring and thinning are discussed as one method to separate individual chips 222 from the second wafer 220, the invention is not so limited. One of ordinary skill in the art, having the benefit of the present disclosure, will recognize that other methods of separating individual chips 222 such as full thickness sawing after wafer connection, etc. are encompassed by the present invention.

In one embodiment, the second wafer 220 is positioned with individual chips 222 in flip-chip orientation to connect to the individual chips 212 on the first wafer 210. In one embodiment, the first wafer includes substantially all high-yield circuits to increase the likelihood that all or most of the individual chips 212 on the first wafer 210 are free of defects. An example of a high-yield circuit in one embodiment includes only re-distribution plane circuitry on the individual chips 212.

In one embodiment the second wafer includes memory chips such as dynamic random access memory, although the invention is not so limited. One method includes testing all individual chips 222 prior to connecting the second wafer 220 to the first wafer 210. Defective chips are identified during the testing process. As shown in FIG. 2C, after individual chips 222 are coupled to the first wafer 210 and separated, defective chips can be removed from the wafer assembly 200 without disturbing the other chips 222 that remain connected to the first wafer 210. The removal of defective chips leaves gaps in the chips 222 such as first gap 234 and second gap 236. Good chips 230 and 232 can then be inserted into gap 234 and gap 236 to form a complete array of chips 222 without any defective chips present. Where chips 222 were thinned prior to defective chip removal, a number of previously thinned good chips are used to fill gaps such as 234 and 236.

The process described above and in FIGS. 2A-2C may be repeated to form multi-wafer stacks. Because defective chips are being removed and replaced as the stack progresses, a final wafer stack includes multiple chip stacks without any defective chips. The assembly process of stacking chips is made easier by stacking wafers, yet the manufacturing yield of a given wafer stack is significantly increased by replacing individual defective chips with good chips along the way during each additional wafer level assembly.

In one embodiment, a holding wafer is attached to the stack of wafers after the last functional wafer is added in the stack. The first wafer, such as the redistribution circuit wafer, can then be diced or separated by thinning, etc. Later, the holding wafer can be removed or diced, etc. to safely separate the individual multi-chip stacks. In one embodiment, the holding wafer attachment is temporary and the individual multi-chip stacks are later removed from the holding wafer. In one embodiment, the last wafer in the stack prior to the holding wafer is scored deeper than the prior wafers to provide for easier separation with less chip thinning.

Many different stacks of chips are contemplated, in accordance with embodiments of the invention, using the techniques described above. One contemplated embodiment of a chip stack includes a high-yield redistribution circuit chip on the bottom, with multiple memory chips stacked on top, with a logic chip such as a processor chip stacked on top. In one embodiment, a logic chip in the stack includes both logic circuitry and static random access memory. Other contemplated configurations include the logic chip located adjacent to the redistribution circuit chip. Specific reasons for such a configuration, such as multiple processor embodiments, are discussed below. Although a chip stack including a redistribution circuit chip, at least one memory chip, and a logic chip are described herein, the invention is not so limited. Techniques described above are useful for manufacturing any stack of more than one chip.

Figure 3A:
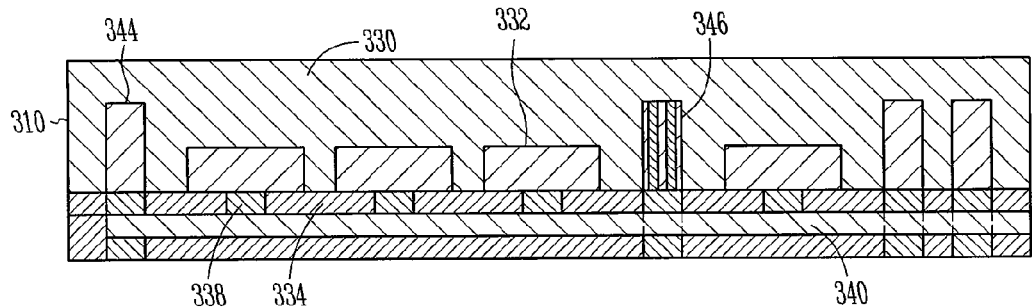
FIG. 3A-3C show cross section views of wafers in various stages of chip assembly according to an embodiment of the invention.
Figure 3B:
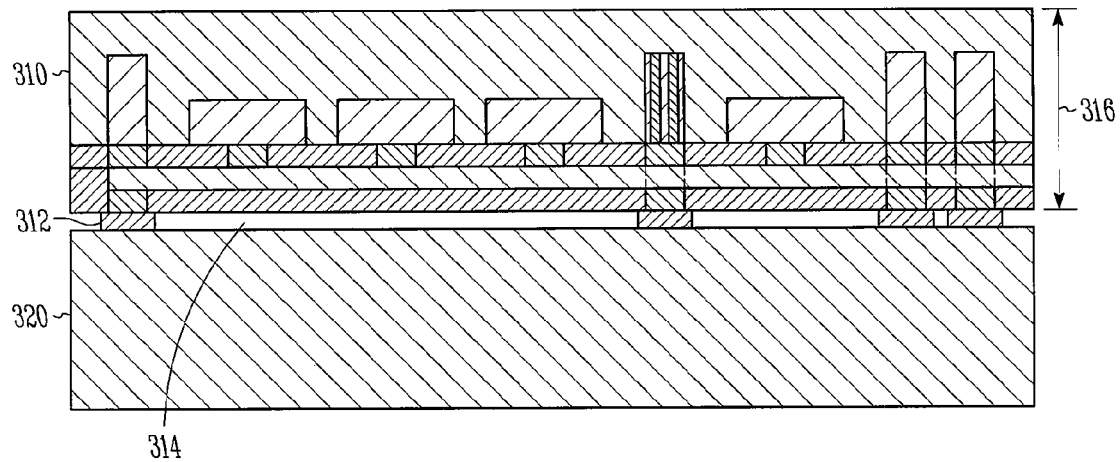
Figure 3C:
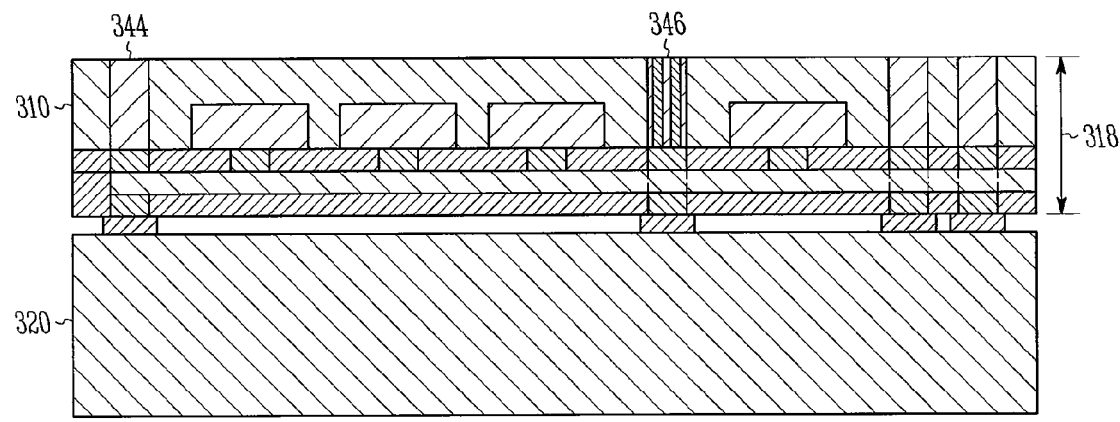

FIGS. 3A-3C show side views of a chip manufacturing operation according to embodiments of the invention. A first chip 310 is shown oriented in flip-chip orientation in FIG. 3A. The first chip 310 includes a number of devices 332 such as transistors, memory cells, etc. The devices 332 are shown formed in a substrate 330 with a thickness 316. Horizontal redistribution circuitry 340, such as metal trace lines, and vias or contacts 338 are shown interconnecting devices 332 within the first chip 310. One or more regions of insulator 334, such as silicon dioxide, may be used to electrically isolate the redistribution circuitry 340.

In one embodiment, the first chip 310 includes a first vertical communication channel 344 and a second vertical communication channel 346. The first vertical communication channel 344 includes a via, or the like. Several types of communication channel 344 are within the scope of the invention, including metal conductors, optical conductors, etc. The second vertical communication channel 346 illustrates a coaxial conductor embodiment. As shown in FIG. 3A, prior to connection to another wafer, the vertical communication channels do not pass through an entire thickness of the first chip 310.

FIG. 3B shows the first chip 310 coupled in flip-chip orientation to a second chip 320 using connection structures 312. In one embodiment, the second chip 320 includes a high-yield chip such as a redistribution circuit chip and the first chip 310 includes a memory chip. However, the description in FIGS. 3A-3C is applicable to a connecting operation between any two chips in a chip stack.

In one embodiment, the connection structures 312 include solder structures such as controlled chip collapse connections (C4). Any of a number of pad metallurgies are possible to support the connection structures 312. One pad metallurgy includes TiNiCuAu pads. In one embodiment TiNiCuAu pads are formed using a liftoff process. One advantage of TiNiCuAu pads formed using a liftoff process includes the ability to form smaller contacts, thus permitting a more dense interconnection configuration. Although solder connection structures 312 are described, the invention is not so limited. Other possible connection structures 312 include gold to gold bonding connection structures, conductive epoxies, conductor filled epoxies, conductive films, etc.

FIG. 3B shows an embodiment where the connection structures 312 leave a gap 314 between the first chip 310 and the second chip 320. In one embodiment the gap 314 is filled with a solid material. In other embodiments the gap 314 is left open. Filled embodiments may use adhesives such as epoxy or other filler material to provide additional mechanical strength to a final multi-chip assembly.

In embodiments where the gap 314 is left open, a cooling fluid such as a gas or liquid is able to pass between individual chips in a chip stack to enhance cooling during operation. In one electronic system embodiment, a cooling system utilizing the gaps 314 is coupled to the system to cool a chip stack formed according to methods described. In one embodiment, the cooling system uses a gas or a compressed gas to flow through the gaps 314 and cool the individual chips. One compressed gas includes compressed hydrogen. One compressed gas includes compressed helium. In selected embodiments, a composite gas of hydrogen and helium is used for cooling. Liquid cooling fluids contemplated for implementation of embodiments of the invention include volatile liquids and supercritical fluids such as liquid carbon dioxide.

FIG. 3C shows the first chip 310 that has been thinned from thickness 316 as shown in FIG. 3B to thickness 318. In addition to completing a scoreline for chip separation as described above, thinning chips in a wafer may be used to expose circuitry for additional chip interconnectivity from the back side of the wafer. FIG. 3C shows the first vertical communication channel 344 and the second vertical communication channel 346 as described above. In one embodiment, the thinning process exposes vertical communication channels in the form of through-wafer interconnects to permit through chip interconnectivity.

One advantage of through chip interconnectivity as opposed to chip edge interconnectivity includes the increased density of interconnectivity that is possible. Chip edge connections between chips in a multi-chip stack are limited by the amount of chip edge real estate. In contrast, through chip connections can pass through any available location within the plane of each chip. In one embodiment, both chip edge connections and through chip connections are used to communicate between chips in a multi-chip stack. Although through chip interconnections are described, embodiments using only chip edge connections are also within the scope of the invention.

Figure 4:
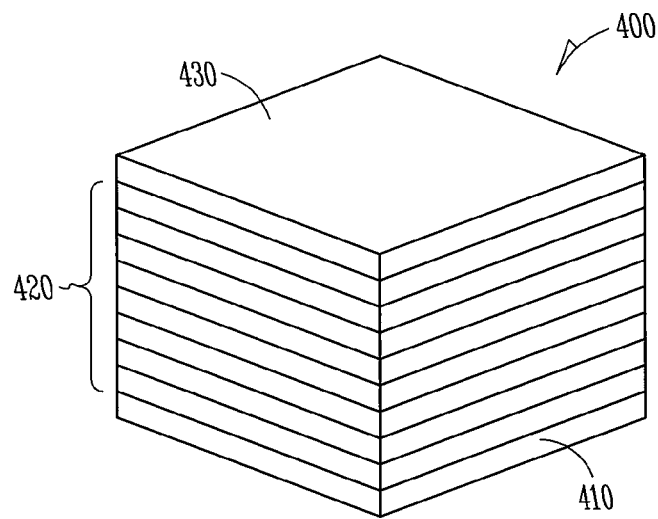
FIG. 4 shows a multi-chip assembly according to an embodiment of the invention.

FIG. 4 shows one embodiment of a chip stack 400 formed using methods described above. In one embodiment, a bottom chip 410 includes a high-yield chip such as a redistribution circuitry chip. A number of memory chips 420 are shown located on top of the redistribution circuitry chip 410. A logic chip 430 such as a processor chip is stacked on top of the chip stack 400. In one embodiment, nine memory chips 420 are stacked on top of the bottom chip 410 with a single logic chip 430 stacked on top of the memory chips 420. Other embodiments include multiple redistribution circuitry chips in a single stack 400, multiple logic chips 430 in a single stack 400, and any of a number of different stacking orders for the stack 400. Placing a redistribution circuitry chip first provides a high-yield base wafer that increases manufacturing yield as described above. Placing at least one logic chip 430 on an outside surface of the stack 400 allows for increased cooling of one of the hotter running chips in the stack.

Figure 5:
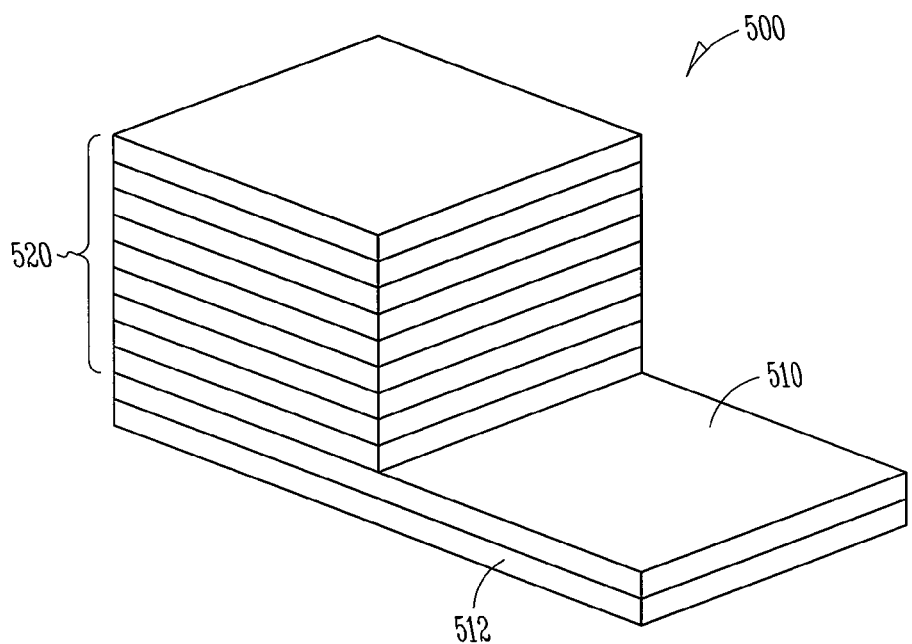
FIG. 5 shows another multi-chip assembly according to an embodiment of the invention.

FIG. 5 shows a chip stack 500 including multiple logic chips such as multiple processors. Two or more redistribution circuitry chips 512 are again used as a base, with two or more logic chips 510 mounted on top of the redistribution circuitry chips 512. A number of memory chips 520 are then stacked on top of the two or more logic chips 510.

While a number of advantages of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A semiconductor wafer assembly, comprising:
   a redistribution plane wafer layer, including a number of chip sized regions in an array; and
   a second wafer layer attached to the redistribution plane wafer layer, including a number of semiconductor chips in an array substantially matching the array of chip sized regions, wherein selected semiconductor chips from the number of semiconductor chips have been removed from the surface of the first wafer layer.

2. The semiconductor wafer assembly of claim 1, wherein the number of chip sized regions includes memory chip sized regions.

3. The semiconductor wafer assembly of claim 1, wherein the number of semiconductor chips includes logic chips.

4. The semiconductor wafer assembly of claim 1, wherein the number of semiconductor chips includes memory chips.

5. A semiconductor wafer assembly, comprising:
   a first wafer, including only redistribution circuitry; and
   a second wafer attached to the first wafer, including a number of flash memory chips, wherein selected chips from the number of flash memory chips have been removed from the surface of the first wafer.

6. The semiconductor wafer assembly of claim 5, wherein the chips in the second wafer are attached to the first wafer using controlled chip collapse connections (C4).

7. The semiconductor wafer assembly of claim 5, wherein the chips in the second wafer are attached to the first wafer using TiNiCuAu pad metallurgy.

8. A multi-chip stack, comprising:
   an end chip that includes only redistribution circuitry;
   a plurality of chips stacked on the end chip, including:
      at least one memory chip; and
      at least one logic chip.

9. The multi-chip stack of claim 8, wherein the at least one memory chip includes a dynamic random access memory (DRAM) chip.

10. The multi-chip stack of claim 8, wherein the at least one memory chip includes a flash memory chip.

11. The multi-chip stack of claim 8, wherein a second end chip, opposite the end chip that includes only redistribution circuitry is thicker than other chips in the plurality of chips.

12. The multi-chip stack of claim 8, wherein the plurality of chips are interconnected using both chip edge connections and through chip connections.

13. An electronic system, comprising:
   a multi-chip stack, including:
      an end chip that includes only redistribution circuitry;
      a plurality of chips stacked on the end chip, including:
         at least one memory chip; and
         at least one logic chip
   a cooling system, coupled to the multi-chip stack to flow a cooling fluid through at least one gap at an interface between at least two chips in the plurality of chips.

14. The electronic system of claim 13, wherein the fluid includes a liquid.

15. The electronic system of claim 13, wherein the fluid includes a supercritical fluid.

16. The electronic system of claim 15, wherein the supercritical fluid includes carbon dioxide.

17. The electronic system of claim 13, wherein the fluid includes a pressurized gas.

18. The electronic system of claim 17, wherein the pressurized gas includes hydrogen.

19. The electronic system of claim 17, wherein the pressurized gas includes helium.

20. The electronic system of claim 17, wherein the pressurized gas includes both hydrogen and helium.

* * * * *